United States Patent
Dokken et al.

(10) Patent No.: US 8,006,149 B2
(45) Date of Patent: Aug. 23, 2011

(54) SYSTEM AND METHOD FOR DEVICE PERFORMANCE CHARACTERIZATION IN PHYSICAL AND LOGICAL DOMAINS WITH AC SCAN TESTING

(75) Inventors: Richard C. Dokken, San Ramon, CA (US); Gerald S. Chan, Saratoga, CA (US); Phillip D. Burlison, Morgan Hill, CA (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 1178 days.

(21) Appl. No.: 11/563,612

(22) Filed: Nov. 27, 2006

(65) Prior Publication Data

US 2008/0126896 A1    May 29, 2008

(51) Int. Cl.
  *G01R 31/3177* (2006.01)
  *G01R 31/40* (2006.01)
(52) U.S. Cl. ........................................ 714/726; 714/733
(58) Field of Classification Search ................ None
  See application file for complete search history.

(56) References Cited

U.S. PATENT DOCUMENTS

| | | | | |
|---|---|---|---|---|
| 6,061,813 A * | 5/2000 | Goishi | ............................. | 714/718 |
| 6,278,956 B1 * | 8/2001 | Leroux et al. | .................. | 702/117 |
| 7,058,869 B2 * | 6/2006 | Abdel-Hafez et al. | ........ | 714/729 |
| 7,292,720 B2 * | 11/2007 | Horger et al. | .................. | 382/131 |
| 7,313,746 B2 * | 12/2007 | Chao et al. | ..................... | 714/729 |
| 7,516,379 B2 * | 4/2009 | Rohrbaugh et al. | ........... | 714/731 |
| 2002/0129310 A1 * | 9/2002 | Shin | .............................. | 714/727 |
| 2005/0222795 A1 * | 10/2005 | Rodgers et al. | ............... | 702/117 |
| 2006/0111873 A1 * | 5/2006 | Huang et al. | .................. | 702/185 |
| 2006/0242473 A1 * | 10/2006 | Wahl et al. | ...................... | 714/700 |

FOREIGN PATENT DOCUMENTS

JP            06051031 A *  2/1994  ................... 714/724
* cited by examiner

*Primary Examiner* — Cynthia Britt
*Assistant Examiner* — Dipakkumar Gandhi
(74) *Attorney, Agent, or Firm* — Holland & Hart, LLP

(57) ABSTRACT

A method for data logging from inside a semiconductor device, yielding timing performance information about the logic behind each and every flip-flop in the scan chain and displaying the sensitivity of certain flipflops to speed related manufacturing defects. The method comprises steps for testing, measuring, storing, and analyzing records for frequency characterization of complex digital semiconductors.

12 Claims, 9 Drawing Sheets

Logic Circuit After Scan Insertion

Figure 1. Logic Circuit Prior to Scan Insertion

Figure 2. Logic Circuit After Scan Insertion

[Para 37] Figure 3. AC-Scan Timing Diagram of "Load-Capture-Unload"

Figure 4. Multiple Scan Patterns and Chains

Figure 5. Frequency Scan Software Process Flow Chart

SYSTEM AND METHOD FOR DEVICE PERFORMANCE CHARACTERIZATION IN PHYSICAL AND LOGICAL DOMAINS WITH AC SCAN TESTING

BACKGROUND

Complex SOC on 90 nm and lower processes generate new fault models. New complex SOC devices using 90 nm and lower processes exhibit more than simple stuck-at fault models. AC Scan patterns are being deployed in both engineering and production for at-speed go/no-go testing. However, identifying the source of speed related problems continues to be a challenge for engineers. The problem being solved in this invention is how to efficiently compress and accumulate massive amounts of failure data from multiple runs of test patterns on die on these larger number of wafers or packaged devices. By analyzing and organizing the raw data according to the method of this invention it becomes economically efficient and physically possible to display the useful information.

Scan Basics

To explain the new software process, it is first necessary to provide some background on established techniques of SCAN and AC-SCAN in semiconductor test. The approach of scan methodology is to replace all flip-flops in a design with scan flip-flops. Scan flip-flops provide two paths into each flip-flop: one for the mission of the design, and a second to facilitate test.

Scan Flip-Flops

There are two most common methods of implementation today:

MUXD

This scan flip-flop approach places a mux on the front end of the D-input. The selector to the mux, known as the scan enable, determines whether to use the mission mode input or the scan test input.

LSSD

Another common scan flip-flop approach is to use two clocks. One clock latches the mission path input into the flip-flop while the second clock latches the scan test input data into the flip-flop.

Scan Chains

By stitching all of the scan flip-flops, or scan cells, together into one or more scan chains, each flip-flop can get preset or observed. This allows for test patterns to be constructed that will concentrate on finding faults in mini sub-circuits.

See the circuit example shown in FIGS. 1 and 2. The first illustration shows the circuit prior to scan insertion, and the second shows the circuit after a MUXD scan insertion. In FIG. 2, Logic Circuit After Scan Insertion, notice that each flip-flop has two input paths as controlled by a multiplexor on the input. When the scan enable "SE" is asserted, the scan chain operates as a shift register. This allows for each flip-flop to be set to a specific state. It also allows for the observation of each flip-flop state as the values are shifted out of the device onto the scan output "SO". We have numbered each flip-flop, or scan cell, for the purpose of referencing.

For this example, the 'and' gate can be tested by shifting data into scan cells 3 and 2. After the desired test condition has been loaded, the scan enable is de-asserted and a clock can be applied to capture the output of the combinational logic as observed at scan cell 1. The scan enable is once more applied and the result data as captured at scan cell 1 can be shifted through the scan chain until it can be seen on the device output for the scan chain.

AC-Scan

The principles of ac-scan are very similar to that of scan. The major difference is that the clock that captures the output of the combinational logic into the observation scan cell is timed to the clock that placed the test condition at the input of the combinational logic. For example, if the spacing between the assertions of the two clocks is 1 ns, the test frequency is 1 GHz.

In the following timing diagram FIG. 3, note that the scan enable "SE" is asserted and four bits of data are loaded into the scan chain through the scan input "SI". Each bit must be clocked "CLK" however, the last of the four clocks is retimed to allow controllable proximity to the capture clock which is applied after scan enable is de-asserted. Now that the tested state is captured in the observation flip-flops, the values can be shifted out on the scan output "SO". This "Load-Capture-Unload" operation is known as a "Scan Pattern" and may be performed thousands of times throughout a test pattern set.

From the example circuit in FIG. 2, there are only 7 paths through the 3 gates as listed:

1. From scan cell 3 through the inverter into scan cell 2
2. From scan cell 3 through the 'and' gate into scan cell 1
3. From scan cell 2 through the 'and' gate into scan cell 1
4. From scan cell 3 through the 'and' gate, through the 'or' gate, into scan cell 0
5. From scan cell 2 through the 'and' gate, through the 'or' gate, into scan cell 0
6. From scan cell 1 through the 'or' gate into scan cell 0

Test patterns can be generated to check the speed of each of these paths for this design. However, with the magnitude of typical designs today, it is impossible to test all paths individually.

There are multiple clocking approaches deployed today including "Launch on Last Shift" and "Launch on Capture" (also known as 2-Cycle Capture) techniques using both external clocks driven by the tester and internal clocks from a PLL inside the device. However, in all approaches, the basic concept of one clock to apply the input to the logic under test and another clock to latch the results into scan cells remains the same. The proximity of these two clocks determines the frequency that the logic is tested at. The proximity of the two clocks is the variable which is swept through a range. Each setting of the two clocks is a testpoint and is referred to as an increment. The proximity may start out wide to enable many passes and with each increment get smaller until no passes are recorded or the proximity may start out very narrow with few passes and progressively widen.

Functional Tester Background

Historically, testers apply a set of simulated stimulus, and validate that the response on the device outputs match the results expected from the simulation. Functional testers are designed to report in a go/no-go fashion that all of the outputs matched the expected results for all checked strobe points or not. Functional testers are not architected to understand design criteria of the device under test such as the scan structures. Thus, while testers can understand which output signals contained failures, each output signal can represent tens of thousands of internal scan cells.

Thus it can be appreciated that what is needed is: a method to associate fail data measured on a tester with the structural, logical, and physical context and performance metric enabling a rapid analysis and understanding of possible clusters of failure that stem from a common design or manufacturing origin; a way to select from huge volumes of test data the information to analyze patterns in defects that result in failures at or above certain speeds of operation; a way to view failures in different contextual backgrounds to determine commonality among failures that may reveal a addressable cause; a way to compress data without losing essential details for analysis in a reasonable and economic time; a way to present data for analysis that can be more easily understood and communicated; and a method of tracing the envelope of failures as a test parameter is swept through a range of values.

SUMMARY OF THE INVENTION

Real-Time Mapping of Pattern Strobes to Scan Cells is accomplished through a software architecture that can associate each strobe point with an internal scan cell. Thus, when a failure occurs, the controlling software process knows the associated scan cell. To accommodate this, the test pattern controlling software has the method of creating a look-up table of each and every "Load-Capture-Unload" operation, also known as a scan pattern, contained in the test pattern set. By recording the start of the unload operation for each scan pattern, and recognizing that all scan chains will unload at the same time, the tester cycle offset from the closest previous unload point prior to a given failure will determine the scan cell position within the chain. The chain is determined by the output signal of the device.

The present invention enables datalogging from inside the device, yielding timing performance information about the logic behind each and every flip-flop in the scan chain. It is understood that a scan cell in a scan chain is represented by a bit position in an array of bits. The present invention further comprises the step of
reporting a timing measurement for each scan cell in a scan chain.

Reporting a timing measurement comprises at least one of:
indicating a timing performance for each bit position in each scan chain;
building a logic hierarchy, wherein the timing for each logic sub-circuit can be analyzed;
surveying a physical layout, wherein the timing for each logic sub-circuit can be analyzed; and
retrieving all failures from an automated test equipment for each search increment.

The method further comprises associating all test failures to scan cells in a scan chain in real time and updating the per scan cell results for each timing increment.

The present invention may be tangibly embodied as an article of manufacture comprising: a computer readable media comprising a data structure, wherein said data structure comprises a representation of a timing measurement for a plurality of scan cells, wherein said plurality comprises two or more scan cells of a scan chain.

ATPG Output Flows Directly to Test System

All commercial ATPG tools generate STIL (IEEE1450 Standard Test Interface Language) files. Stylus™, the Inovys test system OS, loads and executes STIL files directly without additional translation steps. With this information, the test system is enabled to attach every failure to a flip-flop and pattern for fast analysis and then link to ATPG diagnostic tools to identify faults down to the gate-level.

DETAILS OF THE INVENTION

Figure 1:
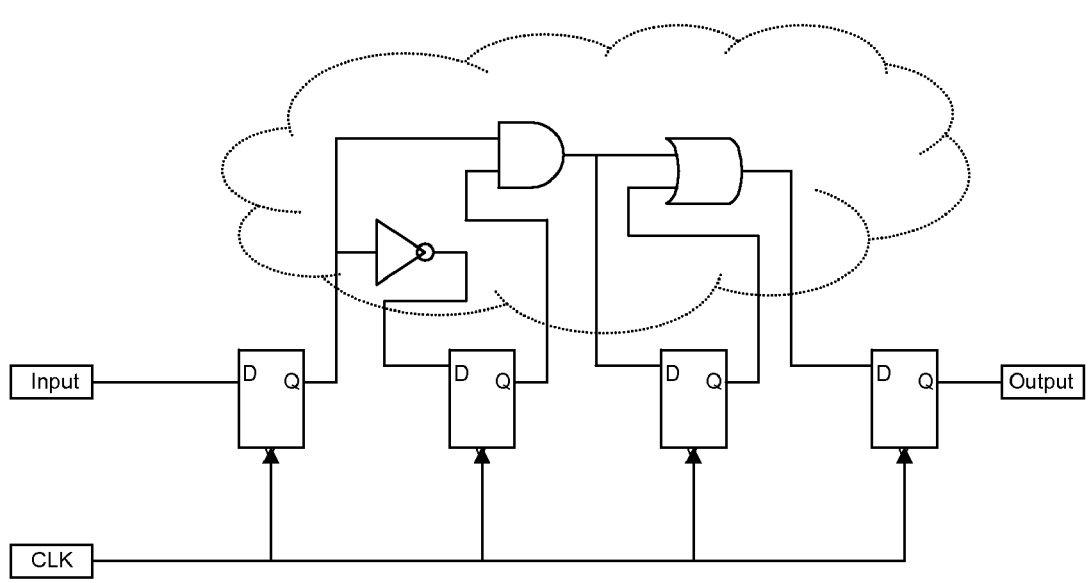
FIG. 1 Schematic of a logic circuit prior to scan insertion
FIG. 2 Schematic of a logic circuit after scan insertion
FIG. 3 AC-Scan Timing Diagram of "Load-Capture-Unload"
FIG. 4 Multiple Scan Patterns and Chains Timing Diagram
FIG. 5 Flowchart of Frequency Scan Software Process
FIG. 6 Embodiment Control of capturing failures by selecting test points
FIG. 7 Embodiment displaying failures in cells in chains at test point
FIG. 8 Embodiment displaying failures in histogram view
FIG. 9 Embodiment displaying failures in hierarchy at certain test point
Figure 2:
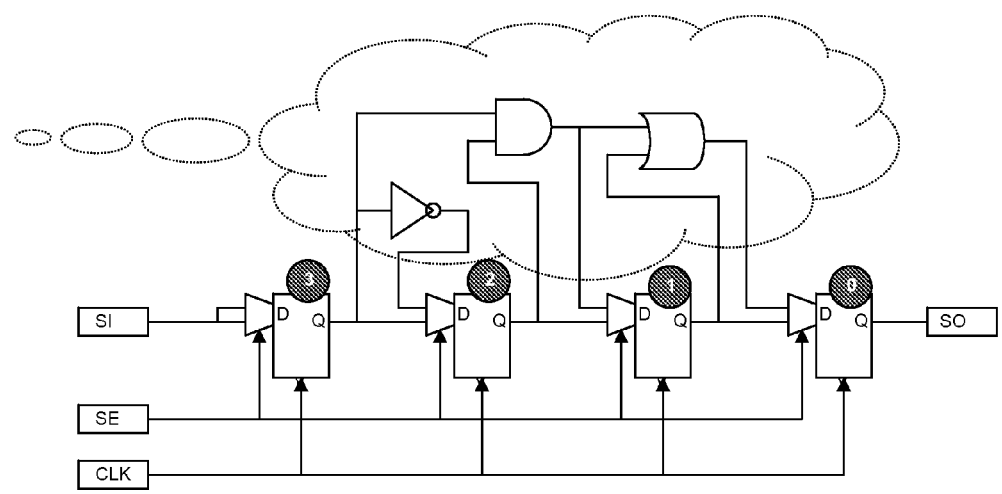
Figure 3:
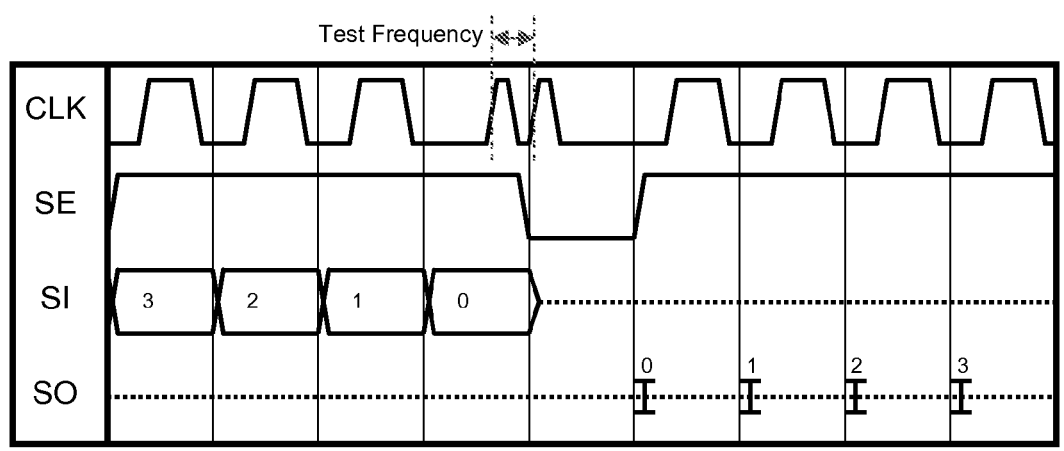
Figure 4:
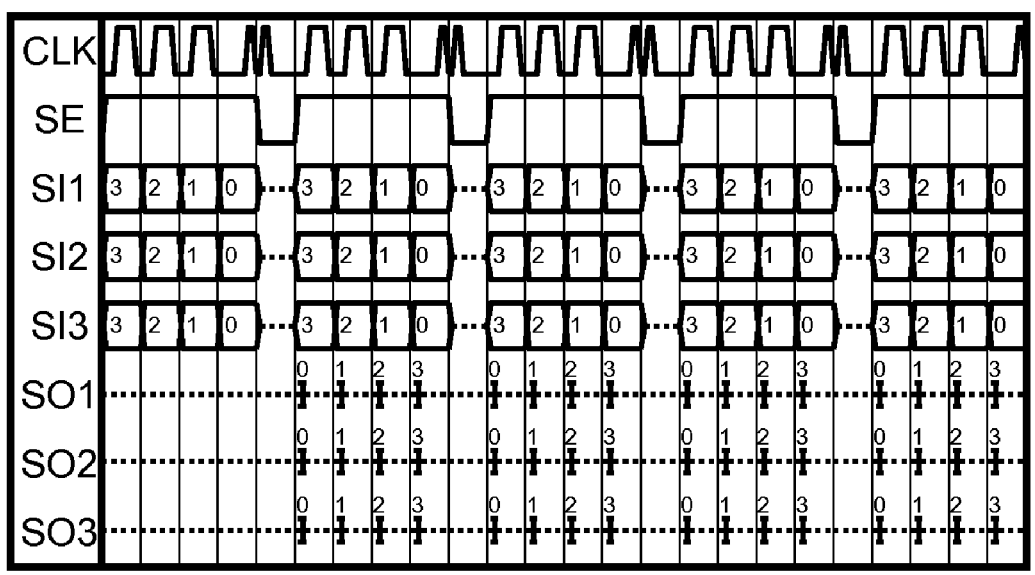

FIG. 4 Multiple Scan Patterns and Chains shows the timing diagram for a test pattern set with four scan patterns, three scan chains, and four scan cells per each chain to illustrate the multiple dimensions. In this example, 48 total strobes are shown for 12 scan cells. For each scan chain, there is a scan output signal. Each scan cell must be stitched into a scan chain.

Applications today may include millions of scan cells. These scan cells are distributed amongst a number of scan chains that may range from a handful to hundreds. Thus, scan chains may contain hundreds of scan cells to tens of thousands. For example, if a device contains 1 million scan cells and 100 scan chains, each scan chain would contain about 10,000 scan cells. The exact number of scan cells in each scan chain is determined by the chip designer. However, the designer usually strives to have balanced scan chains for optimum test time performance.

Regardless of the organization of scan chains, each scan cell is typically strobed per scan pattern. Thus, if the test pattern set contained 10,000 scan patterns for a design that contained 1 million scan cells, there would be a total 10 billion strobes to map to these 1 million scan cells.

The technique for mapping the passes and fails of strobe points to scan cells is to index each strobe point by scan output signal, thus identifying the scan chain. The software keeps a map of the start of the unload operation for each scan pattern by tester cycle count. Thus, when a fail is encountered, the tester cycle count can be referenced against the unload marker to determine the bit position within the chain.

The Frequency Scan Software Process

Figure 5:
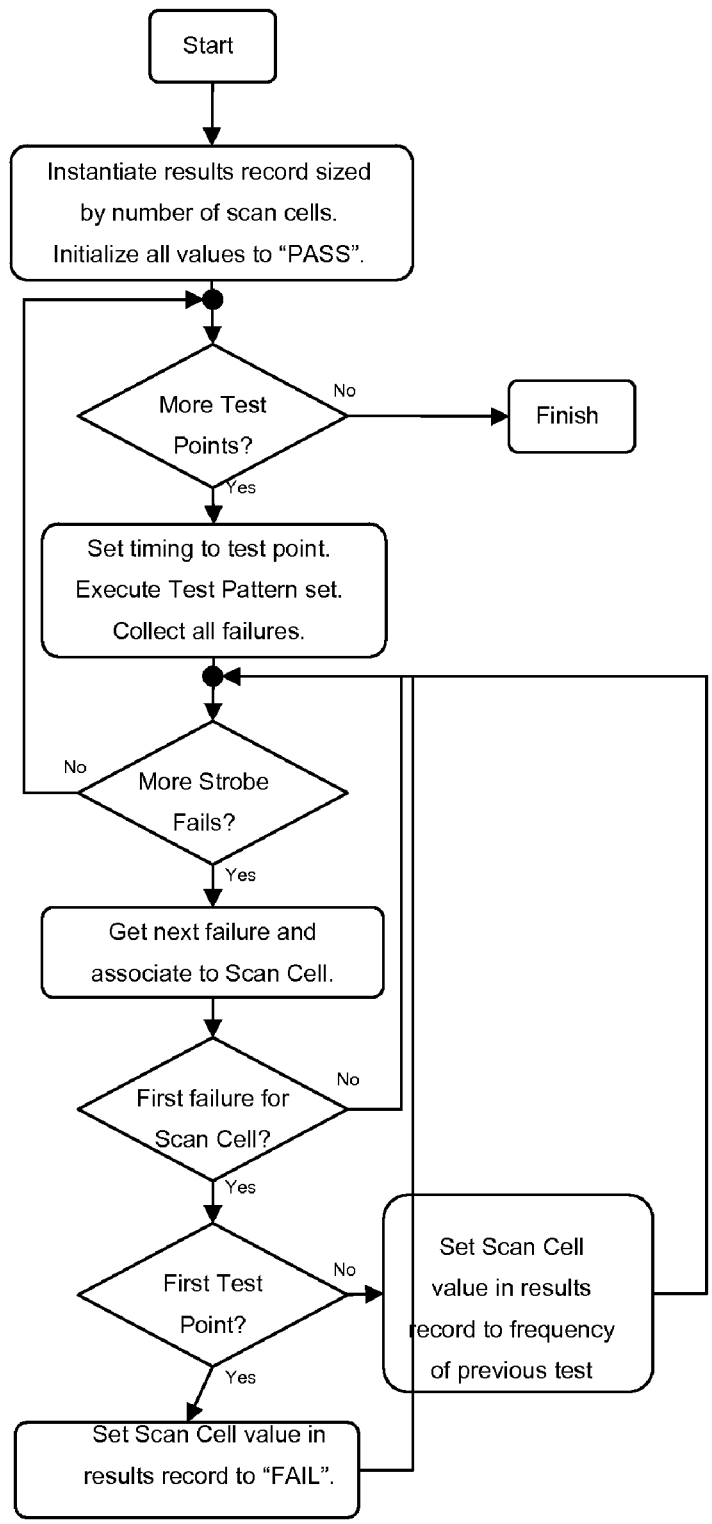
Figure 6:
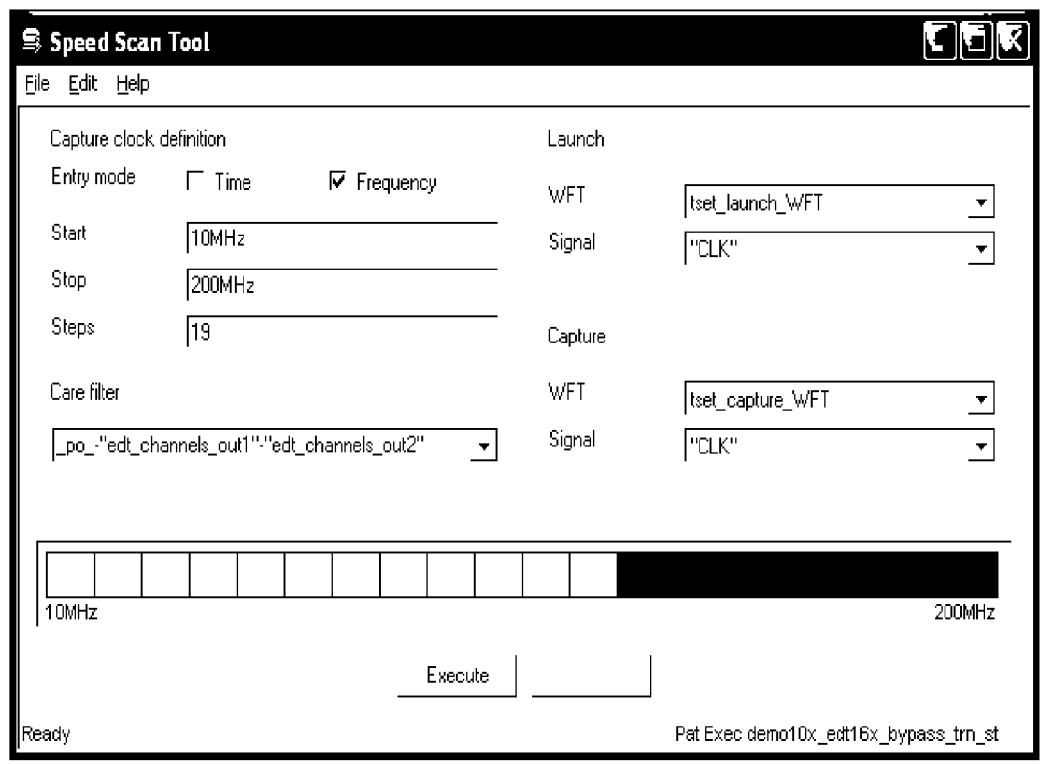
Figure 7:
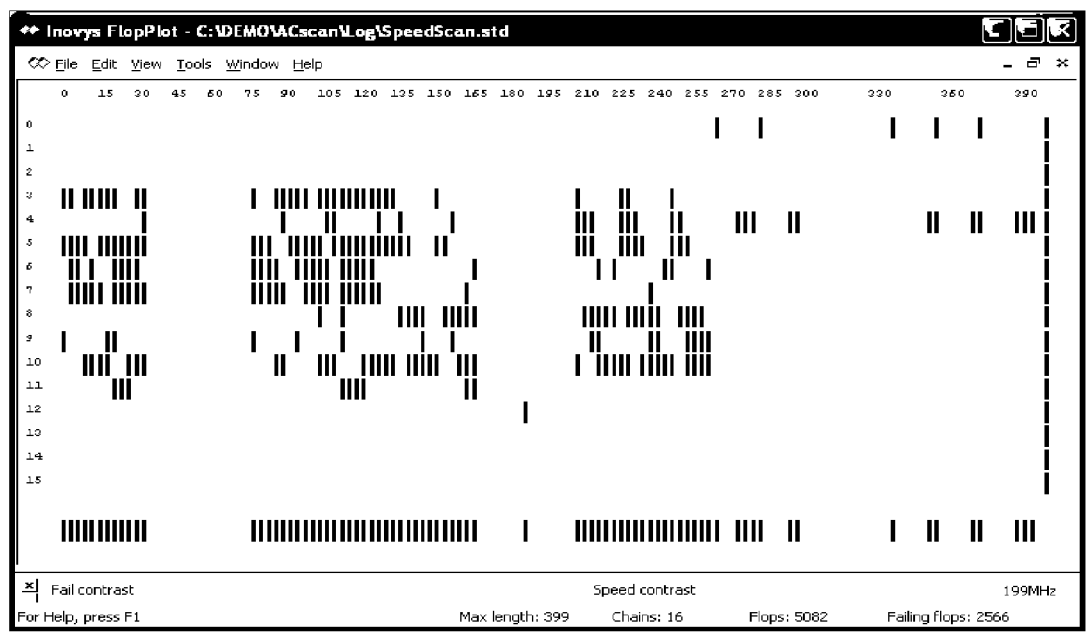
Figure 8:
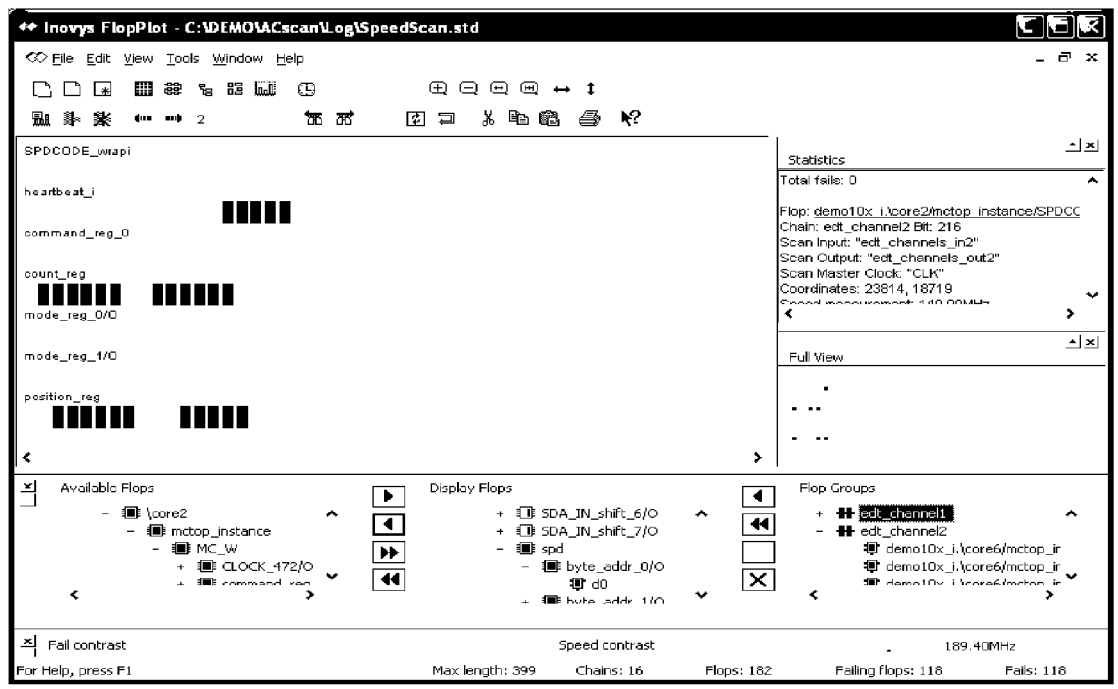
Figure 9:
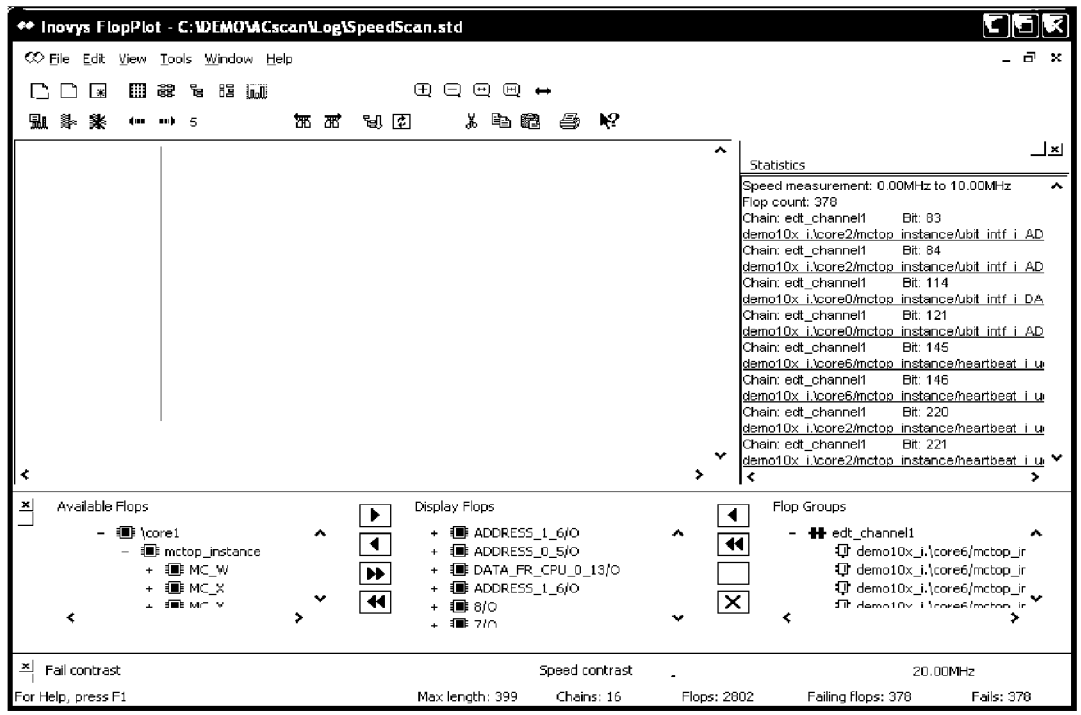

The flow chart in FIG. 5 Frequency Scan Software Process Flow Chart illustrates the frequency scan software process:
  a. Storing a Results Record
    At the start of the frequency sweep, the software will create a results record with an entry per each scan cell in the device design. This record will be initialized with an unmeasured "PASS" result per each scan cell.
  b. Applying tests at Test Points in a frequency spectrum
    The frequency sweep will define a number of frequency test points. For example, sweeping from 300 MHz to 400 MHz with 5 MHz resolution equates to 20 steps or 21 test points. In an embodiment, the process is described to execute the test points in order from the slowest frequency to the highest.
  c. Controlling Timing Setup of a Tester
    For each test point, the timing for the test frequency must be applied. The ac-scan frequency is determined by the proximity of the launch event to the capture event. Thus, whether the tester is driving a reference clock to a PLL, or driving the launch and capture clocks directly through one or more signals, this must be set according to the test point.
    If the tester is providing a reference clock to an internal PLL, the multiplication ratio for the PLL must be provided. For example, if the test point is 3.2 GHz, and the multiplication ratio is 32, the reference clock to the PLL must be set to 100 MHz.

If the tester is providing the launch and capture clocks directly, the position of the capture clock relative to the launch clock must be adjusted. This may require adjustment of the launch clock pulse width. For example, consider default timing for test patterns at 50 MHz launch/capture with 5 ns pulse widths. To change the timing to achieve a 200 MHz test point, the leading edge of the capture clock must be adjusted to 5 ns after the leading edge of the launch clock. This would be at the same point of the trailing edge of the launch clock unless the pulse width of the launch clock is adjusted as well. The process defines the relative placement of the trailing to leading edge of the launch clock at min(1/(freq*2), original p/w).

d. Applying vectors and recording failures

After the timing is set for each test point, the pattern is executed and all failures are collected and mapped to scan cells.

e. Noting transitions between Pass and Fail

These failures collected at each test point will be used to update the results record. If the failure is the first for a scan cell, the scan cell result will be set to the frequency of the previous test point. If this is the first test point, the result will be set to "FAIL".

If the failure is not the first for a scan cell, it will be ignored.

f. Noting never passed and never failed singularities

Any scan cell that does not encounter a strobe failure will be left with the a marker in the results record indicating that either the patterns did not test this cell, or the test points did not exercise a frequency fast enough to induce a failure.

SpeedScan—Data Collection Tool

An embodiment of the present invention, SpeedScan, significantly simplifies the complex process of retrieving the timing performance behind every flip-flop using a single easy to use form. The user selects whether the characterization is to be performed in the time or frequency domain and the Start and Stop parameters. The Launch and Capture clock attributes are selected from drop-down menus populated from Pattern Exec context.

SpeedScan can be invoked from a graphical tool, or from a run-time test program call. The invention further comprises calculating the necessary timing values for each step of the sweep, and applying them to hardware. Conventional wafer level data analysis tools do not have the ability to respond to test programs and in turn control the values applied to test equipment in real time. In the present invention data logging mechanics track results on a flip-flop basis, even for designs with millions of flip-flops, displaying progress with a color spectrum of the number of failing flip-flops at each test point on the sweep. The Care filter can be used to reduce the collected data to specific scan chains of interest. Select specific design elements for display with clearly labeled tree menus.

SpeedMap

An embodiment of the present invention, SpeedMap expands failure analysis capabilities to include speed characterization data. The invention comprises the method of simultaneously displaying at least two of a structural view, a hierarchical view, and a histogram view.

SpeedMap—Structural View

Find Failing Flip-Flops by Scan Chain

Failing flip-flops Viewed with user defined Fail and Speed Contract Resolution.

Structural test results generate complete pattern, chain, and bit information for better problem solving and fast debug.

Users can dial a frequency to get a color spectrum display for each flip-flop as they are stitched into their scan chain. The Fail contrast slider controls the resolution of the fail density. The Speed contrast slider controls the failure frequency display.

SpeedMap—Hierarchical View

View Failures by Design Function

The "Hierarchical View" mode allows users to view failures by functional behavioral blocks—start from a core level and zoom down to the lowest-level design module. In the hierarchical view mode, frequency performance can be observed by filtered circuit.

Select specific design elements for display with clearly labeled tree menus.

SpeedMap—Histogram View

In the histogram view mode, distribution of flip-flop performance is displayed in user defined bins. Flip-flops that fail at all frequencies may be easily identified as False Paths. Flip-flops that fail at much lower than expected frequencies may be easily identified as Multi-Cycle Paths. Flip-flops that do not meet timing criteria can be easily identified to perform further extensive analysis on each path behind each of the flip-flops.

The present invention comprises innovations in three areas, the testing of devices with scan chains and scan cells with pulse pairs along a spectrum of frequencies assigned to test points, the recording of the fastest pass or the slowest failure by scan cell in scan chain, logical hierarchy, and physical coordinates, and displaying the failure data as frequency is swept from slow to fast or fast to slow under user control. This is a method for improving the manufacturing yield of semiconductor devices at higher speeds. The first step is testing a logic device with an AC-Scan pattern at a plurality of testpoints, wherein a testpoint corresponds to a frequency rate of applying a launch-capture pair of clock pulses, and wherein an AC-Scan pattern is synthesized to exercise the flipflops in the critical paths which are most vulnerable to delay defects. While an enormous amount of data is available from this series of tests, it can be efficiently and economically stored as follows:

storing at least three of the following a testpoint representing a frequency at which an AC scan test pattern causes a scan cell to fail, a testpoint representing the highest frequency at which an AC scan test pattern causes a scan cell to pass, an identifier of the scan test pattern which causes the scan cell to fail, an identifier of the position of the scan cell in a scan chain, an identifier of a scan chain in a die, an identifier of a unique die in a wafer, an identifier of a wafer, a hierarchical design name for a failing scan cell consistent with the design database, a physical coordinate of the position of the scan cell in a die, a physical coordinate of the position of the die in a wafer, and a notation in the event that the scan cell has never passed or never failed any of the tests at any of the test points.

The engineer seeking to analyze and cure speed related defects may then visualize the database of failures/frequency by displaying on a graphical computer display at least three of: a movable graphical icon by mouse or keyboard selecting a testpoint on a continuum of frequencies at which speed sensitive test patterns have been applied to the device; a failing scan cell in a scan chain in an array of scan cells in scan chains, said failing scan cell presenting test values inconsistent with expected test values for an AC-Scan test pattern and at least one frequency corresponding to a testpoint; a failing scan cell in a hierarchical list of flip-flops described in a design description language, said failing scan cell presented as one of a block diagram, a net list and an electrical schematic; a failing scan cell in a physical map of the device under test said failing scan cell presented in the context of other scan cells located in the same region of the device; a failing scan cell in a physical map of the wafer under test said failing scan cell presented in the context of other scan cells located in the same region of the wafer.

In summary, the invention comprises a method comprising the following steps: collecting a plurality of test pattern failures; associating one of said plurality of test pattern failures to a scan cell; responsive to a first failure of the first testpoint, setting a scan cell record value in a results record to a frequency of a previous testpoint, displaying the failures in physical, logical, and scan cell order as the user selects a frequency along the continuum of testpoints.

What is claimed is:

1. A method comprising:
    applying a series of test patterns to a scan chain while sweeping a frequency defined by a timing between a launch clock pulse and a capture clock pulse for the scan chain; and
    recording a timing measurement for each scan cell in the scan chain, the timing measurement being recorded for a particular scan cell by i) as each test pattern is unloaded from the scan chain, comprising successive bits unloaded for the particular scan cell, to identify transitions from pass to fail, and ii) recording a frequency corresponding to each transition as a timing measurement for the particular scan cell, whereby data on continuing failures or passes is compressed.

2. The method of claim 1 wherein said recording comprises indicating a timing performance for each scan cell in the scan chain.

3. The method of claim 2 further comprising retrieving all failures in an AC-Scan test pattern unloaded from the scan chain from automated test equipment.

4. A method comprising:
    collecting a plurality of test pattern failures in response to applying a series of test patterns to a scan chain while sweeping a frequency defined by a timing between a launch clock pulse and a capture clock pulse;
    associating at least one of said plurality of test pattern failures to a scan cell;
    responsive to a first failure of the scan cell at a first testpoint, the first testpoint corresponding to one of the frequencies defined by a timing between a launch clock pulse and a capture clock pulse for the scan chain, setting a scan cell value in a results record to a frequency of a previous testpoint in the series of test patterns applied to the scan chain, the frequency providing a timing measurement for the scan cell.

5. An apparatus comprising:
    a tester configured to apply a series of test patterns to a scan chain while sweeping a frequency defined by a timing between a launch clock pulse and a capture clock pulse for the scan chain; and
    a non-transitory computer readable media comprising a data structure, wherein said data structure comprises a representation of a timing measurement for each of a plurality of scan cells in the scan chain, wherein the timing measurement for a particular scan cell corresponds to the timing between the launch clock pulse and the capture clock pulse at which successive bits unloaded for the particular scan cell transition from pass to fail.

6. The apparatus of claim 5 wherein said plurality comprises every scan cell of the scan chain.

7. A method for improving manufacturing yield of semiconductor devices at higher speeds, comprising the steps of:
    testing a logic device with an AC-Scan pattern at a plurality of testpoints, wherein different testpoints correspond to different frequencies of applying a launch-capture pair of clock pulses, and wherein the AC-Scan pattern is synthesized to exercise flipflops in critical paths which are most vulnerable to delay defects;
    storing failure data generated in response to the testing, the failure data including a timing measurement for each scan cell in the logic device associated with a test pattern failure, wherein the timing measurement for a particular scan cell identifies at least one of i) a testpoint representing a lowest frequency at which the AC-Scan pattern causes the particular scan cell to fail, or ii) a testpoint representing a highest frequency at which the AC-Scan pattern causes the particular scan cell to pass; and
    displaying at least some of the failure data.

8. The method of claim 7 wherein storing failure data for the particular scan cell comprises:
    storing at least three of the following
        the testpoint representing the lowest frequency at which the AC-Scan pattern causes the particular scan cell to fail,
        the testpoint representing the highest frequency at which the AC-Scan pattern causes the particular scan cell to pass,
        an identifier of the AC-Scan pattern which causes the scan cell to fail,
        an identifier of the position of the particular scan cell in a scan chain,
        an identifier of the scan chain in a unique die,
        an identifier of the unique the in a wafer,
        an identifier of the wafer,
        a hierarchical design name for the particular scan cell consistent with a design database,
        a physical coordinate of the position of the particular scan cell in the unique die, and
        a physical coordinate of the position of the unique die in the wafer.

9. The method of claim 7 wherein displaying at east some of the failure data comprises:
    displaying on a graphical computer display at least three of:
        a movable graphical icon by mouse or keyboard selecting a testpoint on a continuum of frequencies at which AC-Scan patterns have been applied to the logic device;
        a failing scan cell in a scan chain in an array of scan cells in scan chains, said failing scan cell presenting test values inconsistent with expected test values for an AC-Scan pattern and at least one frequency corresponding to a testpoint;
        a failing scan cell in a hierarchical list of flip-flops described in a design description language, said failing scan cell presented as one of a block diagram, a net list and an electrical schematic;
        a failing scan cell in a physical map of the logic device, said failing scan cell presented in the context of other scan cells located in the same region of the logic device;

a failing scan cell in a physical map of a wafer including the logic device, said failing scan cell presented in the context of other scan cells located in the same region of the wafer.

10. The method of claim 9 wherein said displaying at least some of the failure data further comprises displaying a logic hierarchy of the logic device, wherein the timing for each logic sub-circuit in the logic hierarchy can be analyzed.

11. The method of claim 10 wherein said displaying at least some of the failure data further comprises displaying a physical layout of the logic device, wherein the timing for each logic sub-circuit in the physical layout can be analyzed.

12. The method of claim 7, further comprising the step of:
for each scan cell of the logic device not associated with a test pattern failure, storing a notation that the scan cell never failed the AC-Scan pattern at any of the testpoints.

* * * * *